United States Patent
Lim et al.

(10) Patent No.: US 10,451,682 B2
(45) Date of Patent: Oct. 22, 2019

(54) APPARATUS AND METHOD FOR CONDUCTING NAIL PENETRATION TEST FOR SECONDARY BATTERY

(71) Applicant: LG CHEM, LTD., Seoul (KR)

(72) Inventors: Jin-Hyung Lim, Daejeon (KR); Se-Wook Seo, Daejeon (KR); Yo-Han Ko, Daejeon (KR); Yong-Seok Choi, Daejeon (KR)

(73) Assignee: LG CHEM, LTD., Seoul (KR)

( * ) Notice: Subject to any disclaimer, the term of this patent is extended or adjusted under 35 U.S.C. 154(b) by 260 days.

(21) Appl. No.: 15/562,086

(22) PCT Filed: Sep. 8, 2016

(86) PCT No.: PCT/KR2016/010101
§ 371 (c)(1),
(2) Date: Sep. 27, 2017

(87) PCT Pub. No.: WO2017/043890
PCT Pub. Date: Mar. 16, 2017

(65) Prior Publication Data
US 2018/0074131 A1    Mar. 15, 2018

(30) Foreign Application Priority Data

Sep. 9, 2015  (KR) .................. 10-2015-0127839

(51) Int. Cl.
*G06F 11/30*      (2006.01)
*G01R 31/389*     (2019.01)
(Continued)

(52) U.S. Cl.
CPC .......... *G01R 31/389* (2019.01); *G01R 31/36* (2013.01); *G01R 31/367* (2019.01);
(Continued)

(58) Field of Classification Search
CPC .................................................. G01R 31/389
See application file for complete search history.

(56) References Cited

U.S. PATENT DOCUMENTS

2005/0253591 A1* 11/2005 Kasamatsu .......... G01R 31/392
                                                324/432
2008/0186029 A1   8/2008 Nishino et al.
(Continued)

FOREIGN PATENT DOCUMENTS

JP      2010-212183 A     9/2010
KR   10-2006-0047689 A    5/2006
(Continued)

OTHER PUBLICATIONS

International Search Report, issued in PCT/KR2016/010101, dated Dec. 20, 2016.

*Primary Examiner* — Phuong Huynh
(74) *Attorney, Agent, or Firm* — Birch, Stewart, Kolasch & Birch, LLP

(57) ABSTRACT

An apparatus and method for conducting a nail penetration test for a secondary battery are provided. The apparatus for conducting the nail penetration test includes: a stage on which the secondary battery, which is an object of the nail penetration test, is fixed; a nail penetration unit including a nail elevating/lowering means; a voltage measuring unit configured to repeatedly measure a short-circuit voltage of the secondary battery with a time interval during the nail penetration test; and a controller operably coupled to the voltage measuring unit. The controller periodically receives a short-circuit voltage from the voltage measuring unit, determines a short-circuit current allowing the received short-circuit voltage to be applied between outermost nodes of an equivalent circuit which models the secondary battery whenever the short-circuit voltage is received, and visually (Continued)

outputs a change in the determined value of the short-circuit current according to time through a display unit.

14 Claims, 6 Drawing Sheets

(51) Int. Cl.
*G01R 31/367* (2019.01)
*G01R 31/385* (2019.01)
*G01R 31/36* (2019.01)
*H01M 10/48* (2006.01)
*H01M 10/42* (2006.01)

(52) U.S. Cl.
CPC ...... *G01R 31/385* (2019.01); *H01M 10/4285* (2013.01); *H01M 10/48* (2013.01); *H01M 10/488* (2013.01)

(56) References Cited

U.S. PATENT DOCUMENTS

| 2010/0035131 | A1* | 2/2010 | Park ................. H01M 2/027 |
| | | | 429/94 |
| 2011/0068800 | A1 | 3/2011 | Nishino et al. |
| 2015/0198673 | A1* | 7/2015 | Yang ................. H01M 6/5083 |
| | | | 429/61 |

FOREIGN PATENT DOCUMENTS

| KR | 10-2008-0073667 A | 8/2008 |
| KR | 10-2010-0118189 A | 11/2010 |
| KR | 10-2011-0021970 A | 3/2011 |
| KR | 10-2015-0100500 A | 9/2015 |

\* cited by examiner

APPARATUS AND METHOD FOR CONDUCTING NAIL PENETRATION TEST FOR SECONDARY BATTERY

TECHNICAL FIELD

The present disclosure relates to an apparatus and method for conducting a nail penetration test for secondary battery, and more particularly, to an apparatus and method for conducting a nail penetration test, capable of easily predicting changes of a short-circuit current flowing through a secondary battery by using an equivalent circuit of the secondary battery when a nail penetrates into the secondary battery.

The present application claims priority to Korean Patent Application No. 10-2015-0127839 filed on Sep. 9, 2015 in the Republic of Korea, the disclosure of which is incorporated herein by reference.

BACKGROUND ART

Secondary batteries generate electric energy through electrochemical oxidation and reduction reactions and are widely used for various purposes. The use range of the secondary batteries gradually expands. For example, the secondary batteries are used for apparatuses carried by a human hand such as mobile phones, lap-top computers, digital cameras, video cameras, tablet computers, and motor-driven tools, various electrically-driven power apparatuses such as electric bicycles, electric motorcycles, electric automobiles, hybrid automobiles, electric ships, and electric airplanes, electric power storage apparatuses used for storing power generated through new regeneration energy or surplus generated power, and uninterruptible power systems for stably supplying power to various kinds of information communication apparatuses including server computers and base stations for communication.

A secondary battery has a structure in which an electrode assembly is sealed with electrolyte inside a packaging material and two electrode terminals respectively having different polarities are exposed to the outside of the packaging material. The electrode assembly includes a plurality of unit cells, and the unit cell at least includes a negative electrode plate and a positive electrode plate with a porous separation layer therebetween. The negative electrode plate and the positive electrode plate are coated with an active material, and the secondary battery is charged or discharged by an electrochemical reaction between the active material and the electrolyte.

Meanwhile, in the case where a large impact from a pointed object of a metallic material is applied to the secondary battery, the relevant object may penetrate into the packaging material and thus penetrate into even the electrode plates respectively having the different polarities included in the electrode assembly. In this case, the electrode plates having the different polarities are electrically connected to each other by the metallic object and a short-circuit is formed and a very large short-circuit current flows between the metallic object and the electrode plates penetrated by the metallic object within several seconds. When the short-circuit current flows, a large amount of heat is generated from the electrode plates, and the electrolyte is rapidly decomposed by this heat and thus a large amount of gases is generated. Since a decomposition reaction of the electrolyte corresponds to an exothermic reaction, the temperature of the secondary battery rapidly rises locally around the point through which the pointed object has penetrated, and consequently, the secondary battery ignites and burns.

Therefore, when a new secondary battery is developed, a penetration safety of the secondary battery is verified through a nail penetration test before proceeding with commercialization. The nail penetration test is a test of loading the secondary battery on a test apparatus that may measure the temperature and the voltage of the secondary battery, intentionally inducing a short-circuit inside the secondary battery by allowing a pointed metallic nail having various diameters prepared in advance to penetrate into the secondary battery, measuring a change in the temperature and the voltage of the secondary battery depending on the diameter and the penetration speed of the nail, and determining whether the secondary battery ignites with natural eyes.

However, a related art penetration test apparatus has a problem of having to destroy unnecessarily a considerable number of secondary batteries in order to determine under what penetration condition the secondary battery generates ignition.

Also, to accurately investigate an ignition mechanism of the secondary battery, a change in heat generated by a short-circuit current should be quantitatively calculated by measuring a change in the magnitude of the short-circuit current flowing through a nail penetration point depending on time.

Also, it is required to thermodynamically analyze whether the temperature of the nail penetration point may rapidly rise to an ignition temperature by taking into account heat generated from the penetration point and a heat conduction characteristic of the secondary battery.

However, since the short-circuit current locally flows through the inside of the secondary battery for a very short time through the nail penetration point, it is substantially impossible to directly measure the short-circuit current.

Therefore, a related art nail penetration test apparatus has a limit in accurately investigating an ignition mechanism when a metallic object has penetrated into the secondary battery.

DISCLOSURE

Technical Problem

The present disclosure is designed to solve the problems of the related art, and therefore the present disclosure is directed to providing an apparatus and method for conducting a nail penetration test for a secondary battery, capable of predicting a change in the magnitude of a short-circuit current flowing inside the secondary battery and quantitatively analyzing a heat generating characteristic of a nail penetration point in the nail penetration test for the secondary battery.

Technical Solution

In one aspect of the present disclosure, there is provided an apparatus for conducting a nail penetration test for a secondary battery, the apparatus including: a stage on which the secondary battery, which is an object of the nail penetration test, is fixed; a nail penetration unit including a nail which penetrates into the secondary battery and a nail elevating/lowering means configured to elevate or lower the nail; a voltage measuring unit coupled to electrodes of the secondary battery and configured to repeatedly measure a short-circuit voltage of the secondary battery with a time interval while the nail penetration test is in progress; and a controller operably coupled to the voltage measuring unit, wherein the controller controls the nail penetration unit to lower the nail such that the nail penetrates into the secondary battery, periodically receives the short-circuit voltage from the voltage measuring unit, determines a short-circuit current which allows the received short-circuit voltage to be applied between outermost nodes of an equivalent circuit which models the secondary battery based on the equivalent circuit whenever the short-circuit voltage is received, and visually outputs changes in a value of the determined short-circuit current according to time.

The equivalent circuit may include, as a plurality of circuit elements, a serial resistor, at least one RC circuit, and an open circuit voltage source which varies a voltage depending on a state of charge of the secondary battery. The plurality of circuit elements may be connected to each other in series.

Preferably, the controller may determine the short-circuit current by using Equation ① below.

$$i_{short}=(V_{short}-V_{RC}-V_{OCV})/R_0 \qquad (1)$$

(where $i_{short}$ is a short-circuit current, $V_{short}$ is a short-circuit voltage measured by the voltage measuring unit, $V_{RC}$ is a voltage applied by the RC circuit, $V_{OCV}$ is an open circuit voltage depending on a state of charge of the secondary battery, and $R_0$ is a resistance value of the serial resistor)

Preferably, the controller may time-update $V_{RC}$ of Equation ① by using Equation ②.

$$V_{RC}[k+1]=V_{RC}[k]e^{-\Delta t/R*C}+R(1-e^{-\Delta t/R*C})i_{short}[k] \qquad (2)$$

(where k is a time index, $V_{RC}[k]$ is a value of $V_{RC}$ right before a time update, $V_{RC}[k+1]$ is a value of time-updated $V_{RC}$, $\Delta t$ is a time update period of $V_{RC}$, R and C are respectively a resistance value and a capacitance value of a resistor and a condenser included in the RC circuit, $i_{short}$ is a predicted value of a short-circuit current determined in a previous calculation period)

Preferably, the controller may time-update SOC, which is a state of charge of the secondary battery, by using Equation ③ below. Also, the controller may determine an open circuit voltage $V_{OCV}$ of the secondary battery corresponding to the time-updated state of charge by using the time-updated state of charge and a predefined "state of charge-open circuit voltage lookup table".

$$SOC[k+1]=SOC[k]+100*i_{short}[k]\Delta t/Q_{cell} \qquad (3)$$

(where k is a time index, SOC[k] is a state of charge right before a time update, SOC[k+1] is a time-updated state of charge, $i_{short}$ is a short-circuit current determined in a previous calculation period, $\Delta t$ is a time update period of a state of charge SOC, and $Q_{cell}$ is a capacity of the secondary battery)

According to one aspect of the present disclosure, the controller may determine $R_{short}$, which is a short-circuit resistance of a nail penetration point, by using Equation ④ below, and visually output changes of the short-circuit resistance according to time.

$$R_{short}=V_{short}/i_{short} \qquad (4)$$

(where $R_{short}$ is a short-circuit resistance of a nail penetration point, $V_{short}$ is a short-circuit voltage of the secondary battery, periodically measured by the voltage measuring unit, and $i_{short}$ is a predicted value of a short-circuit current corresponding to a short-circuit voltage of the secondary battery, periodically measured)

According to another aspect of the present disclosure, the controller may measure $Q_{short}$, which is short-circuit Joule's heat generated from a nail penetration point, by using Equation ⑤ below, and visually display changes in the short-circuit Joule's heat according to time.

$$Q_{short}=i_{short}*V_{short} \qquad (5)$$

(where $Q_{short}$ is short-circuit Joule's heat generated from a nail penetration point, $V_{short}$ is a short-circuit voltage of the secondary battery, periodically measured by the voltage measuring unit, and $i_{short}$ is a predicted value of a short-circuit current corresponding to a short-circuit voltage of the secondary battery, periodically measured)

According to another aspect of the present disclosure, the controller may determine $Q_{cell}$, which is resistance Joule's heat generated from a resistance characteristic of the secondary battery, at a penetration point of the secondary battery by using Equation ⑥, and visually output changes of the resistance Joule's heat according to time.

$$Q_{cell}=i_{short}*|V_{short}-V_{OCV}| \qquad (6)$$

(where $Q_{cell}$ is resistance Joule's heat generated from a resistance characteristic of the secondary battery at a nail penetration point, $V_{short}$ is a short-circuit voltage of the secondary battery, periodically measured by the voltage measuring unit, $i_{short}$ is a predicted value of a short-circuit current corresponding to a short-circuit voltage of the secondary battery, periodically measured, and $V_{OCV}$ is a predicted value of an open circuit voltage depending on a state of charge of the secondary battery)

Preferably, the apparatus may further include a display unit operably coupled to the controller, and the controller may visually output, through the display unit, changes of at least one of the short-circuit voltage, the short-circuit current, the short-circuit resistance, the short-circuit Joule's heat, and the resistance Joule's heat according to time.

Preferably, the apparatus may further include a memory unit operably coupled to the controller, and the controller may cumulatively store data for the short-circuit voltage, the short-circuit current, the short-circuit resistance, the short-circuit Joule's heat, and the resistance Joule's heat in the memory unit.

In another aspect of the present disclosure, there is also provided a method for conducting a nail penetration test for a secondary battery, the method including: fixing the secondary battery on a stage; allowing a nail to penetrate into the secondary battery; repeatedly measuring a short-circuit voltage through electrodes of the secondary battery with a time interval; whenever the short-circuit voltage is measured, determining a short-circuit current which allows the measured short-circuit voltage to be applied between outermost nodes of an equivalent circuit which models the secondary battery based on the equivalent circuit; and visually output changes of the determined short-circuit current according to time.

The method may further include: visually outputting changes of the short-circuit voltage according to time.

The method may further include: visually outputting changes of the short-circuit resistance determined from the short-circuit voltage and the short-circuit current according to time.

The method may further include: visually outputting changes of the short-circuit Joule's heat determined from the short-circuit voltage and the short-circuit current according to time.

The method may further include: calculating the resistance Joule's heat by using the short-circuit voltage, the short-circuit current, and an open circuit voltage calculated from a state of charge obtained by adding up the short-circuit currents, and visually outputting changes of the resistance Joule's heat according to time.

The technical objects may be accomplished by a computer-readable recording medium in which the method for conducting the nail penetration test for the secondary battery is programmed and recorded.

Advantageous Effects

According to the present disclosure, it is possible to quantitatively investigate a change in the magnitude of a short-circuit current generated inside a secondary battery when a nail penetrates into the secondary battery. Also, it is possible to quantitatively calculate a change in a short-circuit resistance, or a change in a short-circuit Joule's heat of a nail penetration point, or a change in resistance Joule's heat generated from a resistance of the secondary battery by using a predicted short-circuit current.

Therefore, the present disclosure may be usefully utilized in investigating a thermal behavior of a penetration point, a cause of heat generation, and changes of heat amount when a pointed object penetrates into a secondary battery, and in developing a cooling mechanism in preparation for a penetration accident of the secondary battery.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the scope of the disclosure.

Figure 1:
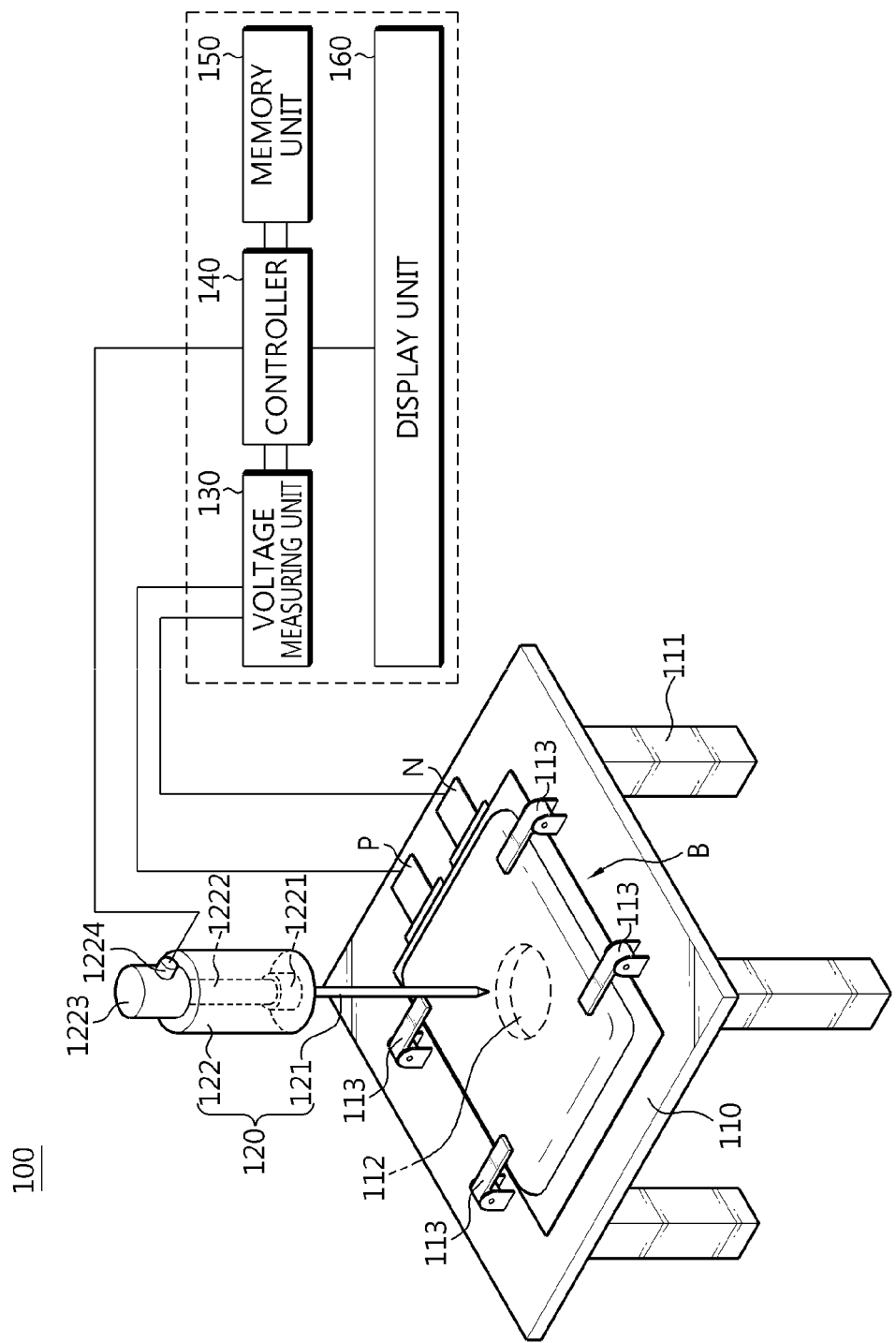
FIG. 1 is a block diagram schematically illustrating a configuration of an apparatus for conducting a nail penetration test for a secondary battery according to an embodiment.

FIG. 1 is a block diagram schematically illustrating a configuration of an apparatus 100 for conducting a nail penetration test for a secondary battery according to an embodiment.

Referring to FIG. 1, the apparatus 100 for conducting the nail penetration test according to the present disclosure includes a stage 110 on which a secondary battery B, which is an object of the nail penetration test, is mounted. The stage 110 may be installed on support frames 111 and may include a through window 112 in a central portion. The through window 112 provides a space through which a peak of a nail 121 that has penetrated into the secondary battery B passes. The stage 110 may include a plurality of clapping means 113 configured to selectively fix the secondary battery B, which is an object of the nail penetration test, on an upper portion thereof.

The apparatus 100 for conducting the nail penetration test according to the present disclosure also includes a nail penetration unit 120 configured to allow the nail 121 having a pointed end to penetrate into the secondary battery B above the stage 110.

The nail penetration unit 120 includes the nail 121 and a nail elevating/lowering means 122 configured to allow the nail 121 to penetrate into the secondary battery B fixed on the stage 110 by lowering the nail 121 in fast speed and to restore the nail 121 to an original location after the nail penetration test terminates.

In an embodiment, the nail elevating/lowering means 122 includes a fixed frame block 1221 to which an upper end of the nail 121 is fixed, an elevating/lowering rail 1222 configured to place the fixed frame block 1221 thereon and move the fixed frame block 1221 in a sliding manner, a linear motor 1223 configured to elevate or lower the fixed frame block 1221 on the elevating/lowering rail 1222 in desired speed, and a motor controller 1224 configured to control a rotation RPM and a rotation direction of the linear motor 1223.

Meanwhile, the present disclosure is not limited to a specific configuration of the nail elevating/lowering means 122 and the linear motor 1223 may be readily replaced with a linear actuator, etc.

The apparatus 100 for conducting the nail penetration test according to the present disclosure also includes a voltage measuring unit 130 configured to periodically measure a terminal voltage applied between a positive electrode P and a negative electrode N of the secondary battery B right after the nail 121 penetrates into the secondary battery B and output a voltage measurement signal corresponding to the measured terminal voltage. Hereinafter, the terminal voltage is referred to as a short-circuit voltage. The voltage measuring unit 130 may be a voltmeter. The present disclosure is not limited to a kind of a device performing a voltage measurement.

The apparatus 100 for conducting the nail penetration test according to the present disclosure also includes a controller 140 configured to determine a short-circuit voltage of the secondary battery B by receiving a voltage measurement signal from the voltage measuring unit 130 after the nail 121 penetrates into the secondary battery B, calculate a short-circuit current flowing through an equivalent circuit of the secondary battery B on the assumption that the short-circuit voltage is applied between outermost nodes of the equivalent circuit by using the equivalent circuit, and generate a short-circuit current profile showing a change of the short-circuit current according to time.

The controller 140 may optionally determine a short-circuit resistance of a penetration point by the nail 121 from the determined short-circuit voltage and short-circuit current, and generate a short-circuit resistance profile showing a change of the short-circuit resistance according to time.

Also, the controller 140 may optionally determine local short-circuit Joule's heat generated from the nail penetration point based on the determined short-circuit voltage and short-circuit current, and generate a short-circuit Joule's heat profile showing a change of the short-circuit Joule's heat according to time.

Also, the controller 140 may determine a state of charge of the secondary battery by adding up the determined short-circuit currents, then determine an open circuit voltage corresponding to the state of charge with reference to a predefined "state of charge-open circuit voltage lookup table", determine resistance Joule's heat generated from a resistance characteristic of the secondary battery based on the determined open circuit voltage, short-circuit voltage, and short-circuit current, and generate a resistance Joule's heat profile showing a change of the resistance Joule's heat according to time.

The controller 140 may selectively include a processor, an application-specific integrated circuit (ASIC), a different chipset, a logic circuit, a register, a communication modem, a data processing unit, etc. in order to execute various control logics described below.

Also, in the case where the control logics are implemented as software, the controller 140 may be implemented as a program module. In this case, the program module may be recorded on a storing medium and executed by a processor. The storing medium may be inside or outside the processor, and may be connected to the processor by various well-known data transmission/reception means.

The apparatus 100 for conducting the nail penetration test according to the present disclosure also includes a memory unit 150 configured to store a nail penetration test program including control logics of the controller 140 and store data generated during a process of executing the control logics.

The controller 140 may receive a voltage signal corresponding to a short-circuit voltage from the voltage measuring unit 130 whenever the short-circuit voltage of the secondary battery is periodically measured, determine a short-circuit voltage, store the short-circuit voltage with a short-circuit current calculated from the short-circuit voltage in the memory unit 150, read out a plurality of short-circuit voltage data and a plurality of short-circuit current data stored in the memory unit 150, and generate a short-circuit voltage profile and a short-circuit current profile.

The controller 140 may determine a short-circuit resistance according to an ohm's law whenever the short-circuit voltage and the short-circuit current are periodically determined, store the short-circuit resistance in the memory unit 150, read out a plurality of short-circuit resistance data stored in the memory unit 150, and generate a short-circuit resistance profile.

The controller 140 may determine local short-circuit Joule's heat generated from the nail penetration point by using a heat amount calculation equation whenever the short-circuit voltage and the short-circuit current are periodically determined, store the local short-circuit Joule's heat in the memory unit 150, read out a plurality of short-circuit Joule's heat data stored in the memory unit 150, and generate a short-circuit Joule's heat profile.

The controller 140 may determine a state of charge of the secondary battery B by adding up the short-circuit currents whenever the short-circuit current is determined, determine an open circuit voltage of the secondary battery corresponding to the determined state of charge with reference to the "state of charge-open circuit voltage lookup table", determine resistance Joule's heat generated from a resistance characteristic of the secondary battery based on the determined open circuit voltage, short-circuit voltage, and short-circuit current, store the resistance Joule's heat in the memory unit 150, read out a plurality of resistance Joule's heat data stored in the memory unit 150, and generate a resistance Joule's heat profile.

The memory unit 150 is a semiconductor memory device and may load a program code executed by the controller 140, record, erase, or update data generated while the controller 140 executes various control logics. The program code may be recoded on a separate electromagnetic or optical recording medium accessible by the controller 140.

The memory unit 150 is not particularly limited to a kind thereof as far as the memory unit is a semiconductor memory device known to the art. For example, the memory unit 150 may be DRAM, SDRAM, a flash memory, ROM, EEPROM, a register, etc. The memory unit 150 may be physically separated from the controller 140 or may be integrated into one body together with the controller 140.

The apparatus 100 for conducting the nail penetration test according to the present disclosure may further include a display unit 160. The display unit 160 may be a liquid crystal display or an organic light-emitting diode display. However, the present disclosure is not limited thereto. Therefore, any display device known to visually output information in the art may be included in the scope of the display unit 160.

The controller 140 may generate at least one of the short-circuit voltage profile, the short-circuit current profile, the short-circuit resistance profile, the short-circuit Joule's heat profile, and the resistance Joule's heat profile by utilizing the data stored in the memory unit 140, and visually output the generated profile through the display unit 160 according to an operator's request.

Though not shown in the drawings, the apparatus 100 for conducting the nail penetration test according to the present disclosure may further include an input device which allows an operator to input various control commands required for the nail penetration test. The input device may be operably coupled to the controller 140. The input device may include a keyboard and a mouse, but the present disclosure is not limited thereto.

Also, the apparatus 100 for conducting the nail penetration test according to the present disclosure may provide a user interface implemented as software to allow an operator to input various control commands.

An operator may set a nail penetration test condition on the user interface, request a visual output of a change of data calculated by the controller 140 according to time, and recognize a change of the relevant data according to time through the display unit 160.

The nail penetration test condition includes an elevating/lowering speed of a nail, an electrical parameter of a circuit element forming a circuit model used for predicting a short-circuit current, for example, a resistance value, a capacitance value, etc., and the state of charge-open circuit voltage lookup table.

Figure 2:
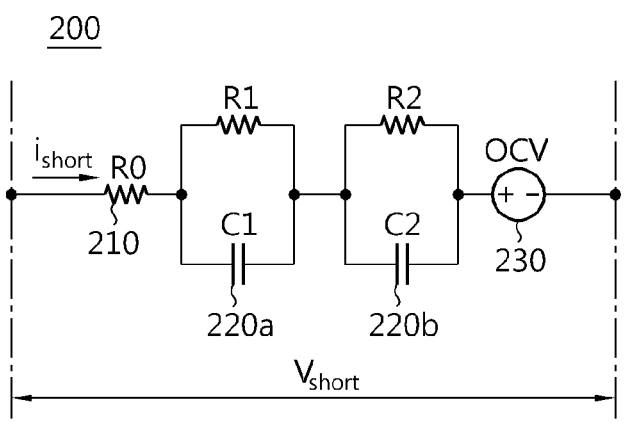
FIG. 2 is a circuit diagram illustrating an equivalent circuit of a secondary battery, which is an object of a nail penetration test.

FIG. 2 is a circuit diagram illustrating an equivalent circuit 200 of a secondary battery, which is an object of a nail penetration test.

Referring to FIG. 2, the equivalent circuit 200 according to an embodiment includes a serial resistor $R_0$ 210 which models an internal resistance of the secondary battery B, one or more RC circuits 220a and 220b which model a polarization characteristic of electrodes when a current flows through the secondary battery B, and an open circuit voltage source 230 which models an open circuit voltage of the secondary battery B uniquely determined depending on a state of charge SOC of the secondary battery B.

Preferably, the equivalent circuit 200 may include two RC circuits in order to independently model polarization characteristics of a positive electrode and a negative electrode of the secondary battery B. The number of RC circuits may be reduced to one or may be increased to three or more.

Hereinafter, for convenience of description, a left RC circuit is a circuit for modeling a polarization characteristic of the positive electrode and is referred to as the first RC circuit 220a, and a right RC circuit is a circuit for modeling a polarization characteristic of the negative electrode and is referred to as the second RC circuit 220b.

A resistance value or a capacitance value of circuit components forming the equivalent circuit 200 changes depending on a kind of the secondary battery B and may be appropriately tuned through experiment. Also, a voltage generated by the open circuit voltage source 230 may be determined by using the "state of charge-open circuit voltage lookup table" pre-defined by a discharging experiment. Here, the discharging experiment denotes an experiment measuring an open circuit voltage for each state of charge while discharging the secondary battery B with a constant current after fully charging the secondary battery B. Also, the "state of charge-open circuit voltage lookup table" has a data structure of a table form, capable of mapping a corresponding open circuit voltage from each state of charge, or conversely, mapping a state of charge from each open circuit voltage.

The present disclosure assumes that when a nail penetrates into the secondary battery B, a short-circuit current $i_{short}$ flowing through the inside of the secondary battery B equally flows through the equivalent circuit 200. Also, the present disclosure assumes that a short-circuit voltage $V_{short}$ measured between the positive electrode and the negative electrode of the secondary battery B while the short-circuit current $i_{short}$ flows is equally applied between outermost nodes of the equivalent circuit 200.

According to the above assumptions, the short-circuit voltage $V_{short}$ may be calculated by sum of a voltage $V_{R0}$ applied to the serial resistor 210, a voltage $V_{RC1}$ applied to the first RC circuit 220a, a voltage $V_{RC2}$ applied to the second RC circuit, and a voltage $V_{OCV}$ applied to the open circuit voltage source 230 as in Equation 1.

$$V_{short}=V_{R0}+V_{RC1}+V_{RC2}+V_{OCV} \qquad \text{<Equation 1>}$$

Since $V_{R0}$ is $i_{short}*R_0$ in Equation 1, when arranging Equation 1 for $i_{short}$, Equation 2 may be obtained.

$$i_{short}=(V_{short}-V_{RC1}-V_{RC2}-V_{OCV})/R_0 \qquad \text{<Equation 2>}$$

In Equation 2, a voltage value periodically measured between the positive electrode and the negative electrode of the secondary battery B may be allocated to $V_{short}$ and updated via measurement.

In Equation 2, $V_{RC1}$ and $V_{RC2}$ may be time-updated by Equation 3 by applying a time-discrete model.

$$V_{RC1}[k+1]=V_{RC1}[k]e^{-\Delta t/R1*C1}+R_1(1-e^{-\Delta t/R1*C1})i_{short}[k]$$

$$V_{RC2}[k+1]=V_{RC2}[k]e^{-\Delta t/R2*C2}+R_2(1-e^{-\Delta t/R2*C2})i_{short}[k] \qquad \text{<Equation 3>}$$

In Equation 3, $\Delta t$ is a time update period, and k and k+1 are time indeces. $V_{RC1}[k]$ and $V_{RC2}[k]$ are voltage values right before time-updated, and $V_{RC1}[k+1]$ and $V_{RC2}[k+1]$ are voltage values after time-updated. R1 and C1 are a resistance value and a capacitance value of a resistor and a condenser included in the first RC circuit 220a and may be tuned to appropriate values through experiment. Similarly, R2 and C2 are a resistance value and a capacitance value of a resistor and a condenser included in the second RC circuit 220b and may be tuned to appropriate values through experiment. $i_{short}[k]$ is a short-circuit current value predicted right before time-updated.

Since a short-circuit current is ignorably small right after the nail penetrates into the secondary battery B, $V_{RC1}[1]$, $V_{RC2}[1]$, and $i_{short}[1]$ may be initialized to 0.

In Equation 2, $V_{OCV}$ may be determined by a method of time-updating a state of charge of the secondary battery B by adding up short-circuit currents flowing through the equivalent circuit 200 using Equation 4, and looking up an open circuit voltage corresponding to the time-updated state of charge with reference to the "state of charge-open circuit voltage lookup table".

$$SOC[k+1]=SOC[k]+100*i_{short}[k]\Delta t/Q_{cell} \qquad \text{<Equation 4>}$$

In Equation 4, $\Delta t$ is a time update period of a state of charge, and $Q_{cell}$ is a capacity of the secondary battery B. Right after the nail penetrates into the secondary batter B, a short-circuit current is ignorably small. Therefore, a state of charge obtained from the "state of charge-open circuit voltage lookup table" by using an open circuit voltage of the secondary battery B measured before the nail penetrates into the secondary battery B is allocated to an initial value of SOC[1] corresponding to an initial condition. Also, from SOC[2], a state of charge is time-updated and determined by inputting the short-circuit current obtained from Equation 2 into Equation 4.

Hereinafter, a process in which the controller 140 periodically determines a short-circuit current flowing through the equivalent circuit 200 by using above equations when a nail penetrates into the secondary battery B is described more specifically.

Figure 3:
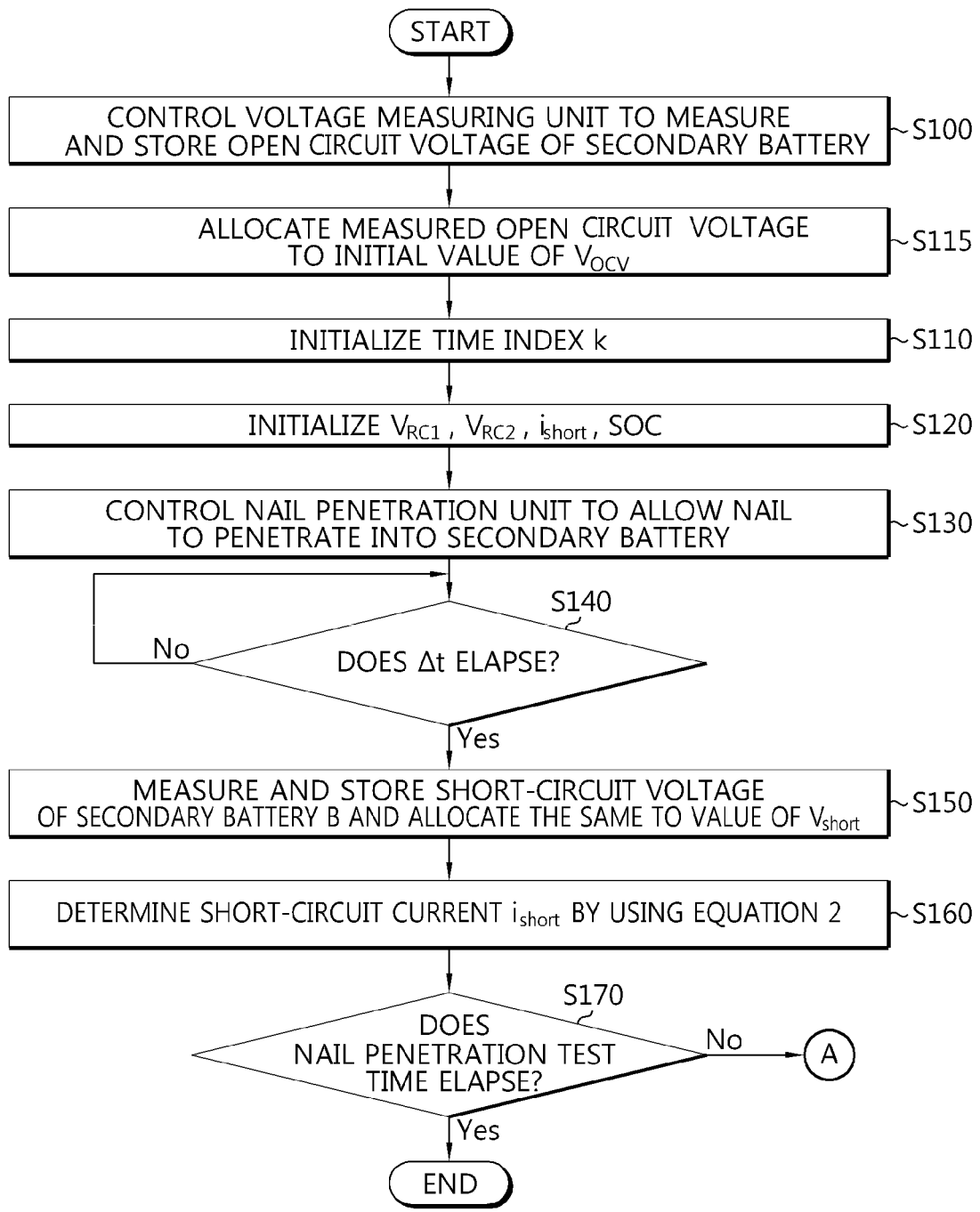
FIGS. 3 and 4 are flowcharts illustrating a process in which a controller determines a short-circuit current flowing through the inside of a secondary battery right after a nail penetrates into the secondary battery by using the equivalent circuit of FIG. 2.
Figure 4:
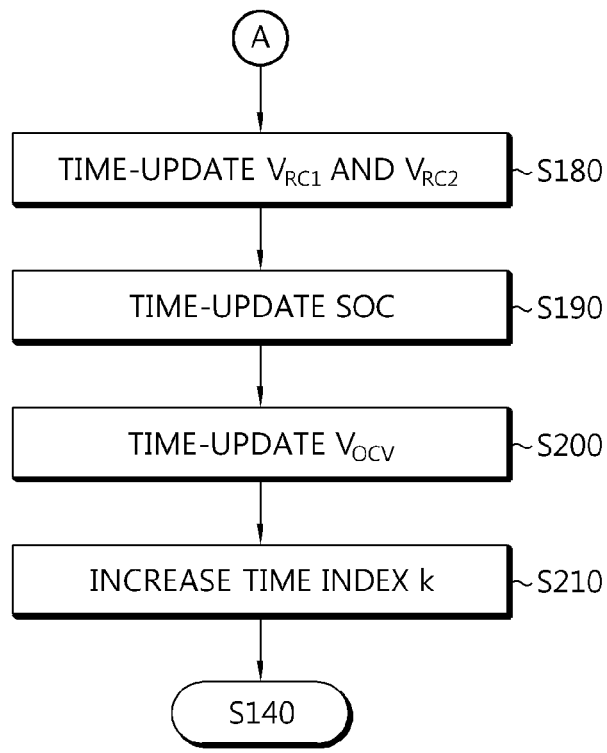

FIGS. 3 and 4 are flowcharts illustrating a process in which the controller 140 determines a short-circuit current flowing the inside of the secondary battery B right after the nail penetrates into the secondary battery B by using the equivalent circuit 200 of FIG. 2 according to an embodiment.

As illustrated, when a nail penetration test starts first, the controller 140 measures an open circuit voltage of the secondary battery B fixed on the stage 110 by using the voltage measuring unit 130, and stores the measured open circuit voltage in the memory unit 150 (S100). Next, the controller 140 allocates the measured open circuit voltage to an initial value of $V_{OCV}$ (S115).

Subsequently, the controller 140 initializes a time index k to 1 (S110), allocates 0 to initial values of a voltage $V_{RC1}$ applied to the first RC circuit 220a of the equivalent circuit 200, a voltage $V_{RC2}$ applied to the second RC circuit 220b, and a short-circuit current $i_{short}$ flowing through the equivalent circuit 200, and initializes SOC, which is a state of charge of the secondary battery B, by using the open circuit voltage of the secondary battery B measured in operation S100 and the "state of charge-open circuit voltage lookup table" (S120).

Subsequently, the controller 140 controls the nail penetration unit 120 according to a nail penetration speed set by an operator to lower the nail toward the secondary battery B fixed on the stage 110 and allow the nail to penetrate into the secondary battery B (S130).

Subsequently, the controller 140 determines whether a preset time Δt has elapsed from a penetration point of time which is a reference time (S140). Here, Δt substantially corresponds to a calculation period of a short-circuit current, for example, may be a time value of 100 ms or less.

When determining that Δt has not elapsed in operation S140, the controller 140 stands by progress of a process. On the contrary, when determining that Δt has elapsed in operation S140, the controller 140 proceeds with operation S150.

In operation S150, the controller 140 measures a short-circuit voltage of the secondary battery B by using the voltage measuring unit 130, stores the same in the memory unit 150, and allocates the measured short-circuit voltage to a value of $V_{short}$.

Subsequently, the controller 140 determines a short-circuit current $i_{short}$ by inputting a value of $V_{short}$ determined in operation S150, a value of $V_{OCV}$ determined in operation S115, and values of $V_{RC1}$ and $V_{RC2}$ initialized in operation 120 into Equation 2 (S160).

Subsequently, the controller 140 determines whether a preset nail penetration test time has elapsed (S170). For example, the nail penetration test time may be set to within tens of seconds.

When determining that the nail penetration test time has elapsed in operation S170, the controller 140 ends the process according to the present disclosure. On the contrary, when determining that the nail penetration test time has not elapsed in operation S170, the controller 140 proceeds with operation S180 (see FIG. 4).

In operation S180, the controller 140 time-updates a voltage $V_{RC1}$ applied to the first RC circuit 220a and a voltage $V_{RC2}$ applied to the second RC circuit 220b by inputting the initial values of $V_{RC1}$ and $V_{RC2}$ determined in operation S120 and the value of $i_{short}$ determined in operation S160 into Equation 3.

$$V_{RC1}[2]=V_{RC1}[1]e^{-\Delta t/R1*C1}+R_1(1-e^{-\Delta t/R1*C1})i_{short}[1]$$

$$V_{RC2}[2]=V_{RC2}[1]e^{-\Delta t/R2*C2}+R_2(1-e^{-\Delta t/R2*C2})i_{short}[1] \qquad \text{<Equation 3>}$$

Subsequently, the controller 140 time-updates a state of charge SOC of the secondary battery B by inputting the value of $i_{short}$ determined in operation S160 and the initial value of the state of charge SOC of the secondary battery B determined in operation S120 into Equation 4 (S190).

$$SOC[2]=SOC[1]+100*i_{short}[1]\Delta t/Q_{cell} \qquad \text{<Equation 4>}$$

Subsequently, the controller 140 determines an open circuit voltage corresponding to time-updated SOC by using the time-updated value of SOC determined in operation S190 and the "state of charge-open circuit voltage lookup table", and time-updates a value of $V_{OCV}$ by using the determined open circuit voltage (S200).

Subsequently, the controller 140 increases the time index k by 1 (S210) and proceeds with operation S140. After that, when the condition that the time Δt has elapsed is satisfied again, the controller 140 measures the short-circuit voltage of the secondary battery B again by using the voltage measuring unit 130, stores the same in the memory unit 150, and updates the measurement of $V_{short}$ by replacing the value of $V_{short}$ with the newly measured short-circuit voltage value.

Subsequently, the controller 140 determines a short-circuit current $i_{short}$ of the secondary battery B at a current time index by inputting again $V_{RC1}$ and $V_{RC2}$, and $V_{OCV}$ time-updated in operation S180 and operation S200, and $V_{short}$ measurement-updated in operation S150 into Equation 2 (S160).

The above-determined short-circuit current $i_{short}$ is used for time-updating $V_{RC1}$, $V_{RC2}$, SOC, and $V_{OCV}$ in operations S180, S190, and S200 when the condition that the nail penetration test time has elapsed is not satisfied in operation S170.

The time update of $V_{RC1}$, $V_{RC2}$, SOC, and $V_{OCV}$ by using Equations 3 and 4, and the measurement update of the value of $V_{short}$ through measurement of the short-circuit voltage of the secondary battery B are periodically repeated as the time index k increases until the nail penetration test time elapses, and the value of the short-circuit current $i_{short}$ of the secondary battery B is time-updated whenever the updated voltage values, that is, $V_{RC1}$, $V_{RC2}$, and $V_{short}$ are input into Equation 2.

Preferably, the controller 140 may cumulatively store values of $V_{short}$ periodically measurement-updated in operation S150 in the memory unit 150. Also, when an operator's request is received, the controller 140 may generate a short-circuit voltage profile by using a plurality of short-circuit voltage data $V_{short}$ stored in the memory unit 150 and visually display the generated short-circuit voltage profile through the display unit 160.

Also, the controller 140 may cumulatively store values of $i_{short}$ periodically time-updated in operation S160 by using Equation 2 in the memory unit 150. Also, when an operator's request is received, the controller 140 may generate a short-circuit current profile by using a plurality of short-circuit current data $i_{short}$ stored in the memory unit 150 and visually display the generated short-circuit current profile through the display unit 160.

Meanwhile, the controller 140 may optionally predict a short-circuit resistance with respect to a penetration point of the secondary battery B and generate a change thereof as a profile.

That is, the controller 140 may determine a short-circuit resistance of the penetration point based on Equation 5 whenever the time index increases by using the value of the short-circuit voltage $V_{short}$ measurement-updated in operation S150 and the value of the short-circuit current $i_{short}$ time-updated in operation S160, and cumulatively store the determined values of the short-circuit resistance in the memory unit 150.

$$R_{short}=V_{short}/i_{short} \qquad \text{<Equation 5>}$$

Also, when an operator's request is received, the controller 140 may generate a short-circuit resistance profile by using a plurality of short-circuit resistance data $R_{short}$ stored in the memory unit 150 and visually display the generated short-circuit resistance profile through the display unit 160.

Also, the controller 140 may optionally predict a short-circuit Joule's heat generated from the penetration point of the secondary battery B and generate a change thereof as a profile.

That is, the controller 140 may determine the short-circuit Joule's heat based on Equation 6 whenever the time index increases by using the value of the short-circuit voltage $V_{short}$ measurement-updated in operation S150 and the value of the short-circuit current $i_{short}$ time-updated in operation S160, and cumulatively store the determined values of the short-circuit Joule's heat in the memory unit 150.

$$Q_{short}=i_{short}*V_{short} \qquad \text{<Equation 6>}$$

Also, when an operator's request is received, the controller 140 may generate a short-circuit Joule's heat profile by using a plurality of short-circuit Joule's heat data $Q_{short}$ stored in the memory unit 150 and visually display the generated short-circuit Joule's heat profile through the display unit 160.

Also, the controller 140 may optionally predict resistance Joule's heat generated by a resistance of the secondary battery B, that is, the resistances of the serial resistor 210 and the first and second RC circuits 220a and 220b during the nail penetration test of the secondary battery B and generate a change thereof as a profile.

That is, the controller 140 may determine the resistance Joule's heat based on Equation 7 whenever the time index increases by using the value of the short-circuit voltage $V_{short}$ measurement-updated in operation S150, the value of the short-circuit current $i_{short}$ time-updated in operation S160, and the value of $V_{OCV}$ time-updated in operation S200, and cumulatively store the determined values of the resistance Joule's heat in the memory unit 150.

$$Q_{cell}=i_{short}*|V_{short}-V_{OCV}| \qquad \text{<Equation 7>}$$

Meanwhile, one or more various control logics performed by the controller 140 are combined and the combined control logics may be written in a computer-readable code system and recorded on a computer-readable recording medium. The recording medium is not particularly limited to a specific kind as far as the recording medium is accessible by a processor included in a computer. For example, the recording medium includes at least one of ROM, RAM, a register, CD-ROM, a magnetic tape, a hard disk, a floppy disk, and an optical data recording apparatus. Also, the code system may be modulated into carrier signals and included in a communication carrier at a specific point of time, or distributed over computers connected via a network, and stored and executed by the computers. Also, functional programs, codes, and code segments for implementing the combined control logics may be easily inferred by programmers of the technical field to which the present disclosure pertains.

<Exemplary Experiment>

Hereinafter, effects of the present disclosure are described through exemplary experiment. It is obvious to a person of ordinary skill in the art that since the exemplary experiment described in the present specification is provided for understanding of the present disclosure, the scope of the present disclosure is not limited to the exemplary experiment.

First, a pouch type lithium polymer secondary battery having a capacity of 37 Ah and a state of charge of 80% has been prepared. Next, the prepared secondary battery is loaded on the stage of the apparatus for conducting the nail penetration test according to the present disclosure and fixed with the clapping means. Also, the positive electrode and the negative electrode of the secondary battery are connected to the voltage measuring unit (a voltmeter). Next, a metallic nail having a circular cross-section and a diameter of 6 mm is mounted on the nail penetration unit and then allowed to penetrate into the secondary battery by lowering the nail at a speed of 20 mm/s, and the state is maintained for 20 seconds.

While the nail penetration test is in progress, the short-circuit voltage $V_{short}$ of the secondary battery has been repeatedly measured by using the voltmeter with a period of 100 ms and cumulatively stored in the memory unit 150. Whenever the short-circuit voltage is measured, the algorithms illustrated in FIGS. 3 and 4 are executed and whenever the time index increases, the short-circuit current $i_{short}$, the short-circuit resistance $R_{short}$, the short-circuit Joule's heat $Q_{short}$, and the resistance Joule's heat $Q_{cell}$ of the secondary battery are determined, and respective data are cumulatively stored in the memory unit 150. In the present exemplary experiment, calculation periods of respective parameters have been set to substantially the same as the measurement period of the short-circuit voltage.

In an equivalent circuit used for the present exemplary experiment, a serial resistance value has been tuned to 0.00102Ω. Also, a resistance value and a capacitance value of a resistor and a condenser included in the first RC circuit have been respectively tuned to 0.0003Ω and 667 F. Also, a resistance value and a capacitance value of a resistor and a condenser included in the second RC circuit have been respectively tuned to 0.0010Ω and 2000 F.

<Experiment Results>

Figure 5:
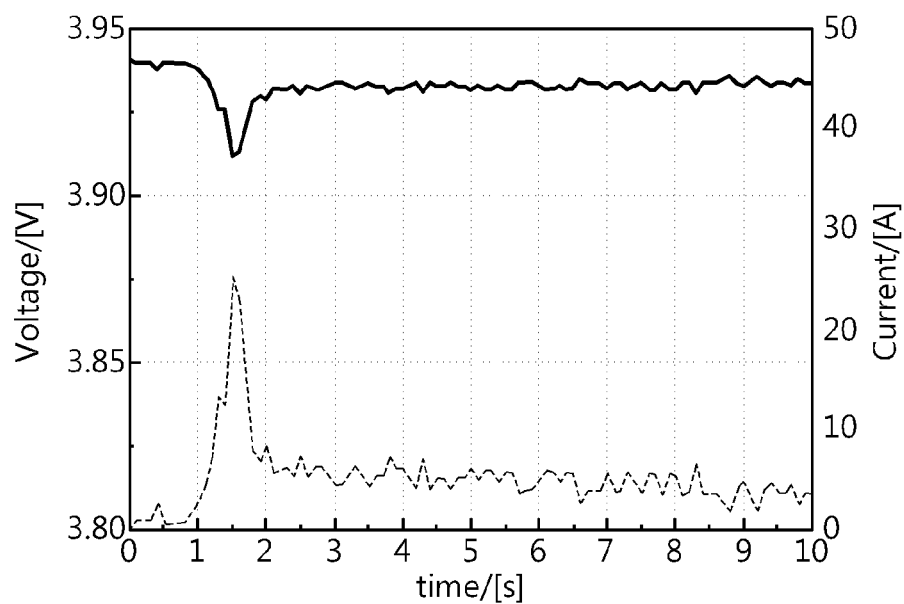
FIG. 5 is a graph illustrating a profile (a solid line) of a short-circuit voltage $V_{short}$ measured for 10 seconds right after a nail penetrates into a secondary battery in an exemplary experiment of the present disclosure, and a profile (a dotted line) of a short-circuit current $i_{short}$ predicted for 10 seconds by using an equivalent circuit.

FIG. 5 is a graph illustrating a profile (a solid line) showing a change of a short-circuit voltage $V_{short}$ according to time, measured for 10 seconds right after a nail penetrates into a secondary battery in an exemplary experiment of the present disclosure, and a profile (a dotted line) showing a change of a short-circuit current $i_{short}$ according to time, predicted for 10 seconds by using an equivalent circuit.

Referring to FIG. 5, it can be seen that the short-circuit current $i_{short}$ has rapidly increased 1 second after the nail has penetrated into the secondary battery and then has been stabilized after 2 seconds. A change behavior of the short-circuit current $i_{short}$ is contrary to a change behavior of the short-circuit voltage $V_{short}$. That is, it is revealed that the short-circuit voltage $V_{short}$ has rapidly decreased after 1 second and then has been stabilized after 2 seconds. A section in which the short-circuit voltage $V_{short}$ has rapidly decreased coincides with a section in which the short-circuit current $i_{short}$ has rapidly increased. This experiment results shows that the short-circuit current $i_{short}$ predicted by using the equivalent circuit may simulate well a short-circuit current flowing through a portion into which the nail actually penetrates.

Figure 6:
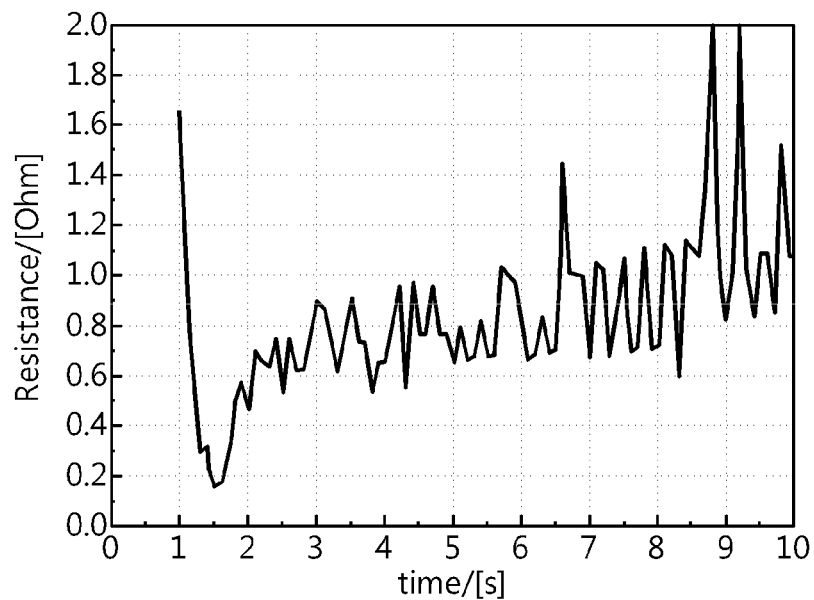
FIG. 6 is a short-circuit resistance profile showing a change of a short-circuit resistance $R_{short}$ according to time, predicted for 10 seconds in an exemplary experiment of the present disclosure.
Figure 7:
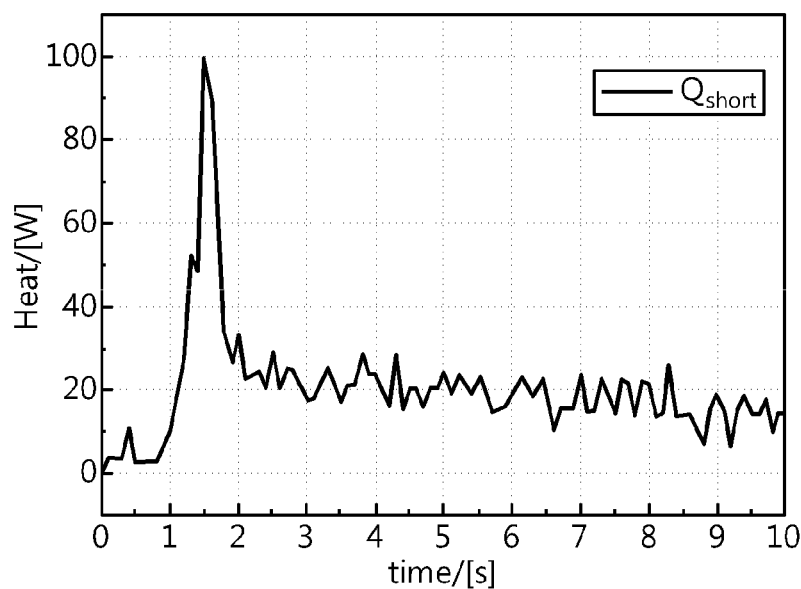
FIG. 7 is a short-circuit Joule's heat profile showing a change of short-circuit Joule's heat $Q_{short}$ according to time predicted for 10 seconds in an exemplary experiment of the present disclosure.
Figure 8:
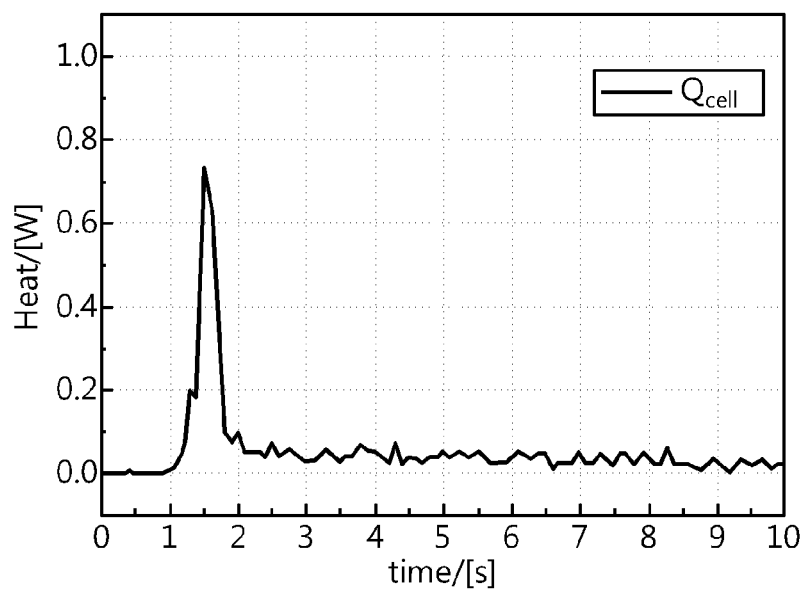
FIG. 8 is a resistance Joule's heat profile showing a change of resistance Joule's heat $Q_{cell}$ according to time predicted for 10 seconds in an exemplary experiment of the present disclosure.

FIG. 6 is a short-circuit resistance profile showing a change of a short-circuit resistance $R_{short}$ according to time, predicted for 10 seconds in an exemplary experiment of the present disclosure, FIG. 7 is a short-circuit Joule's heat profile showing a change of short-circuit Joule's heat $Q_{short}$ according to time, predicted for 10 seconds in an exemplary experiment of the present disclosure, and FIG. 8 is a resistance Joule's heat profile showing a change of resistance Joule's heat $Q_{cell}$ according to time, predicted for 10 seconds in an exemplary experiment of the present disclosure.

Referring to FIGS. 6 to 8, the short-circuit resistance $R_{short}$ shows a rapidly decreasing pattern in a time section in which the short-circuit current $i_{short}$ rapidly increases. Also, it has been revealed that the short-circuit Joule's heat $Q_{short}$ and the resistance Joule's heat $Q_{cell}$ rapidly increase in a time section in which the short-circuit current $i_{short}$ rapidly increases. Also, it has been revealed that the resistance Joule's heat $Q_{cell}$ is smaller by a level of 1/100 of the short-circuit Joule's heat $Q_{short}$.

These experiment results suggest that the apparatus for conducting the nail penetration test according to the present disclosure may be usefully utilized for quantitatively investigating a thermal behavior of the nail penetration point, a cause of heat generation, and changes of heat amount when the pointed object penetrates into the secondary battery, and developing a cooling mechanism in preparation for a penetration accident of the secondary battery.

In describing various embodiments of the present application, elements referred to as a 'unit' should be understood as functionally divided elements rather than physically divided elements. Therefore, each element may be selectively integrated with another element, or each element may be divided into sub-elements for efficient execution of control logic(s). However, when identity of function may be admitted even though elements are integrated or divided, it is obvious to a person of ordinary skill in the art that the integrated or divided elements should be construed as being within the scope of the present application.

Although the present application has been described through limited embodiments and drawings, the present application is not limited thereto and it is obvious that various changes and modifications may be made by those skilled in the art to which the present application pertains within the disclosure of the present application and equivalent scope of appended claims.

INDUSTRIAL APPLICABILITY

According to the present disclosure, it is possible to quantitatively investigate a change in the magnitude of a short-circuit current generated from the inside of the secondary battery when a nail penetrates into the secondary battery. Also, it is possible to quantitatively calculate a change in a short-circuit resistance, or a change in a short-circuit Joule's heat of the nail penetration point, or a change in resistance Joule's heat generated from a resistance of the secondary battery by using a short-circuit current.

Therefore, the present disclosure may be usefully utilized for quantitatively investigating a thermal behavior of the nail penetration point, a cause of heat generation, and changes of heat amount when the pointed object penetrates into the secondary battery, and developing a cooling mechanism in preparation for a penetration accident of the secondary battery.

What is claimed is:

1. An apparatus for conducting a nail penetration test for a secondary battery, the apparatus comprising:
   a stage on which the secondary battery, which is an object of the nail penetration test, is fixed;
   a nail penetration unit comprising a nail which penetrates into the secondary battery and a nail elevating/lowering means configured to elevate or lower the nail;
   a voltage measuring unit coupled to electrodes of the secondary battery and configured to repeatedly measure a short-circuit voltage of the secondary battery with a time interval while the nail penetration test is in progress;
   a display unit configured to visually display information; and
   a controller operably coupled to the voltage measuring unit,
   wherein the controller controls the nail penetration unit to lower the nail such that the nail penetrates into the secondary battery, periodically receives the short-circuit voltage from the voltage measuring unit, determines a short-circuit current which allows the received short-circuit voltage to be applied between outermost nodes of an equivalent circuit which models the secondary battery based on the equivalent circuit whenever the short-circuit voltage is received, and visually outputs changes in a value of the determined short-circuit current according to time through the display unit.

2. The apparatus of claim 1, wherein the equivalent circuit comprises, as a plurality of circuit elements, a serial resistor, at least one RC circuit, and an open circuit voltage source which varies a voltage depending on a state of charge of the secondary battery, the plurality of circuit elements being connected to each other in series.

3. The apparatus of claim 2, wherein the controller determines the short-circuit current by using an equation below:

$$i_{short}=(V_{short}-V_{RC}-V_{OCV})R_0$$

where $i_{short}$ is a short-circuit current, $V_{short}$ is a short-circuit voltage measured by the voltage measuring unit, $V_{RC}$ is a voltage applied by the RC circuit, $V_{OCV}$ is an open circuit voltage depending on a state of charge of the secondary battery, and $R_0$ is a resistance value of the serial resistor.

4. The apparatus of claim 3, wherein the controller time-updates $V_{RC}$ by using an equation below:

$$V_{RC}[k+1]=V_{RC}[k]e^{-\Delta t/R*C}+R(1-e^{-\Delta t/R*C})i_{short}[k]$$

where k is a time index, $V_{RC}[k]$ is a value of $V_{RC}$ right before a time update, $V_{RC}[k+1]$ is a value of time-updated $V_{RC}$, $\Delta t$ is a time update period of $V_{RC}$, R and C are respectively a resistance value and a capacitance value of a resistor and a condenser included in the RC circuit, and $i_{short}$ is a predicted value of a short-circuit current determined in a previous calculation period;
the controller time-updates SOC, which is a state of charge of the secondary battery, by using an equation below:

$$SOC[k+1]=SOC[k]+100*i_{short}[k]\Delta t/Q_{cell}$$

where k is a time index, SOC[k] is a state of charge right before a time update, SOC[k+1] is a time-updated state of charge, $i_{short}$ is a short-circuit current determined in a previous calculation period, $\Delta t$ is a time update period of a state of charge SOC, and $Q_{cell}$ is a capacity of the secondary battery; and
the controller determines an open circuit voltage $V_{OCV}$ of the secondary battery corresponding to the time-updated state of charge by using the time-updated state of charge and a predefined "state of charge-open circuit voltage lookup table".

5. The apparatus of claim 1, wherein the controller determines $R_{short}$, which is a short-circuit resistance of a nail penetration point, by using an equation below:

$$R_{short}=V_{short}/i_{short}$$

where $R_{short}$ is a short-circuit resistance of a nail penetration point, $V_{short}$ is a short-circuit voltage of the secondary battery, periodically measured by the voltage measuring unit, and $i_{short}$ is a predicted value of a short-circuit current corresponding to a short-circuit voltage of the secondary battery, periodically measured, and visually outputs changes of the short-circuit resistance according to time through the display unit.

6. The apparatus of claim 1, wherein the controller measures $Q_{short}$, which is short-circuit Joule's heat generated from a nail penetration point, by using an equation below:

$$Q_{short}=i_{short}*V_{short}$$

where $Q_{short}$ is short-circuit Joule's heat generated from a nail penetration point, $V_{short}$ is a short-circuit voltage of the secondary battery, periodically measured by the voltage measuring unit, and $i_{short}$ is a predicted value of a short-circuit current corresponding to a short-circuit voltage of the secondary battery, periodically measured, and visually outputs changes in the short-circuit Joule's heat according to time through the display unit.

7. The apparatus of claim 1, wherein the controller determines $Q_{cell}$, which is resistance Joule's heat generated from a resistance characteristic of the secondary battery, at a penetration point of the secondary battery by using an equation below:

$$Q_{cell}=i_{short}*|V_{short}-V_{OCV}|$$

where $Q_{cell}$ is resistance Joule's heat generated from a resistance characteristic of the secondary battery at a nail penetration point, $V_{short}$ is a short-circuit voltage of the secondary battery, periodically measured by the voltage measuring unit, $i_{short}$ is a predicted value of a short-circuit current corresponding to a short-circuit voltage of the secondary battery, periodically measured, and $V_{OCV}$ is a predicted value of an open circuit voltage depending on a state of charge of the secondary battery, and visually outputs changes of the resistance Joule's heat according to time through the display unit.

8. A method for conducting a nail penetration test for a secondary battery, the method comprising:
(a) fixing the secondary battery on a stage;
(b) allowing a nail to penetrate into the secondary battery;
(c) repeatedly measuring a short-circuit voltage through electrodes of the secondary battery with a time interval;
(d) whenever the short-circuit voltage is measured, determining a short-circuit current which allows the measured short-circuit voltage to be applied between outermost nodes of an equivalent circuit which models the secondary battery based on the equivalent circuit; and
(e) visually outputting changes of the determined short-circuit current.

9. The method of claim 8, wherein the equivalent circuit comprises, as a plurality of circuit elements, a serial resistor, at least one RC circuit, and an open circuit voltage source which varies a voltage depending on a state of charge of the secondary battery, the plurality of circuit elements being connected to each other in series.

10. The method of claim 9, wherein the operation (d) comprises determining the short-circuit current by using an equation below:

$$i_{short}=(V_{short}-V_{RC}-V_{OCV})/R_0$$

where $i_{short}$ is a short-circuit current, $V_{short}$ is a short-circuit voltage measured by a voltage measuring unit, $V_{RC}$ is a voltage applied by the RC circuit, $V_{OCV}$ is an open circuit voltage depending on a state of charge of the secondary battery, and $R_0$ is a resistance value of the serial resistor.

11. The method of claim 10, wherein the operation (d) comprises:
(d1) time-updating $V_{RC}$ by using an equation below:

$$V_{RC}[k+1]=V_{RC}[k]e^{-\Delta t/R*C}+R(1-e^{-\Delta t/R*C})i_{short}[k]$$

where k is a time index, $V_{RC}[k]$ is a value of $V_{RC}$ right before a time update, $V_{RC}[k+1]$ is a value of time-updated $V_{RC}$, $\Delta t$ is a time update period of $V_{RC}$, R and C are respectively a resistance value and a capacitance value of a resistor and a condenser included in the RC circuit, and $i_{short}$ is a predicted value of a short-circuit current determined in a previous calculation period;

(d2) time-updating SOC, which is a state of charge of the secondary battery, by using an equation below:

$$SOC[k+1]=SOC[k]+100*i_{short}[k]\Delta t/Q_{cell}$$

where k is a time index, SOC[k] is a state of charge right before a time update, SOC[k+1] is a time-updated state of charge, $i_{short}$ is a short-circuit current determined in a previous calculation period, $\Delta t$ is a time update period of a state of charge SOC, and $Q_{cell}$ is a capacity of the secondary battery; and (d3) determining an open circuit voltage $V_{OCV}$ of the secondary battery corresponding to the time-updated state of charge by using the time-updated state of charge and a predefined "state of charge-open circuit voltage lookup table".

12. The method of claim 8, further comprising:
determining $R_{short}$, which is a short-circuit resistance of a nail penetration point, by using an equation below:

$$R_{short}=V_{short}/i_{short}$$

where $R_{short}$ is a short-circuit resistance of a nail penetration point, $V_{short}$ is a short-circuit voltage of the secondary battery, periodically measured by a voltage measuring unit, and $i_{short}$ is a predicted value of a short-circuit current corresponding to a short-circuit voltage of the secondary battery, periodically measured; and visually outputting changes of the short-circuit resistance.

13. The method of claim 8, further comprising:
determining which is short-circuit Joule's heat generated from a nail penetration point, by using an equation below:

$$Q_{short}=i_{short}*V_{short}$$

where $Q_{short}$ is short-circuit Joule's heat generated from a nail penetration point, $V_{short}$ is a short-circuit voltage of the secondary battery, periodically measured by a voltage measuring unit, and $i_{short}$ is a predicted value of a short-circuit current corresponding to a short-circuit voltage of the secondary battery, periodically measured; and visually outputting changes in the short-circuit Joule's heat.

14. The method of claim 8, further comprising:
determining $Q_{cell}$, which is resistance Joule's heat generated from a resistance characteristic of the secondary battery, at a penetration point of the secondary battery by using an equation below:

$$Q_{cell}=i_{short}*|V_{short}-V_{OCV}|$$

where $Q_{cell}$ is resistance Joule's heat generated from a resistance characteristic of the secondary battery at a nail penetration point, $V_{short}$ is a short-circuit voltage of the secondary battery, periodically measured by a voltage measuring unit, $i_{short}$ is a predicted value of a short-circuit current corresponding to a short-circuit voltage of the secondary battery, periodically measured, and $V_{OCV}$ is a predicted value of an open circuit voltage depending on a state of charge of the secondary battery; and visually outputting changes of the resistance Joule's heat.

* * * * *